United States Patent [19]

Cragon et al.

[11] Patent Number: 4,982,264
[45] Date of Patent: Jan. 1, 1991

[54] HIGH DENSITY INTEGRATED CIRCUIT PACKAGE

[75] Inventors: Harvey Cragon, Austin; Charles L. Hutchins, Sugar Land, both of Tex.

[73] Assignee: Texas Instruments Incorporated, Dallas, Tex.

[21] Appl. No.: 393,052

[22] Filed: Aug. 8, 1989

Related U.S. Application Data

[63] Continuation of Ser. No. 706,430, Feb. 27, 1985, abandoned.

[51] Int. Cl.$^5$ ............................................ H01L 23/16
[52] U.S. Cl. ........................................ 357/75; 357/80
[58] Field of Search ............... 174/52 FP; 357/80, 81, 357/75, 76, 69–71; 361/396, 407, 412, 413, 414, 415; 165/80.3, 185

[56] References Cited

U.S. PATENT DOCUMENTS

| | | | |
|---|---|---|---|
| 4,502,098 | 2/1985 | Brown | 361/415 |
| 4,517,138 | 5/1985 | Fukuoka et al. | 357/80 |

FOREIGN PATENT DOCUMENTS

| | | | |
|---|---|---|---|
| 2008496 | 9/1971 | Fed. Rep. of Germany | 174/52 PE |
| 2022895 | 12/1971 | Fed. Rep. of Germany | 357/76 |

OTHER PUBLICATIONS

Henle, R. A., "Vertical Chip Packaging," *IBM Technical Disclosure Bulletin*, vol. 20, No. 11A, pp. 4339–4340, (4/1978).

*Electronics*, "Grooved Substrate Boosts IC Cooling", S. W. Fields, vol. 55, No. 7, Aug. 25, 1982, pp. 46–47.

*Primary Examiner*—Frank Gonzalez
*Attorney, Agent, or Firm*—Melvin Sharp; James T. Comfort; Carlton H. Hoel

[57] ABSTRACT

The specification discloses a package for a large number of integrated circuits. The package includes a top piece and a bottom piece formed of crystalline silicon with two levels of conductor regions formed in the top and bottom pieces. The integrated circuits are placed vertically between the top and bottom pieces and are held to the top and bottom pieces by high temperature adhesives. Solder balls which are placed on integrated circuits after the fabrication of the integrated circuits are then heated to cause the solder balls to reflow onto their respective connectors in the top and bottom pieces. TAB type conductors are then connected to the top and bottom pieces so that the integrated circuit held within this embodiment of the present invention may be connected to other circuitry.

12 Claims, 3 Drawing Sheets

HIGH DENSITY INTEGRATED CIRCUIT PACKAGE

This application is a continuation, of application Ser. No. 06/706,430, filed Feb. 27, 1985 now abandoned.

FIELD OF THE INVENTION

This invention relates to the field of integrated circuit packaging.

BACKGROUND OF THE INVENTION

The first functional, and reasonably reliable, random access memory was designed and built by Jay Forrester of MIT as part of the Whirlwind project. In August of 1953, the first bank of storage containing one thousand 16-bit words was wired into the whirlwind. This bank of memory occupied approximately 30 cubic feet. In the thirty years since this epic event, memory designers have exerted unending efforts to reduce the physical size of random access memories. A major breakthrough occurred in the early 1970's with the introduction of reliable MOS dynamic memory devices. Due to their intrinsically small size and extremely low power requirements, a step function improvement occurred in the reduction of memory volume. Today, a memory module of 2 megabyte capacity can be contained in a volume of less than a tenth of a cubic foot, a three hundred to one volume reduction and a thousand to one increase in storage capacity.

There are three considerations which motivate the drive for reduced memory size.

1. Reducing the size of any product generally reduces the manufacturing cost. This has been particularly true with random access memories during the transition from core to semiconductor followed by the continued decrease in price of semiconductor devices.
2. The limit to the speed of operation of a random access memory can be limited by the memory's physical size. If the memory system is large, the propagation delays through the memory can limit the overall speed of the computer.
3. Frequently there are product constraints which demand, for the product to be feasible, that a given amount of memory must be contained within a limited physical space. This constraint appears within many military systems and in the commercial world of products such as desk top computers.

One of the fundamental limits on the performance of a computer is the memory access time. This is the time required to transmit a memory address to the memory and receive an item of data from the memory. The von Neumann architecture is ultimately limited in its performance to the speed with which this memory access function can be executed. The access time is made up only in part by the access time of the memory devices themselves. In addition to this access time, there are various times associated with driving the address bus, decoding the address, and driving the data bus back to the processor. The highest theoretical potential for high speed performance is found when the memory device is in juxtaposition to the processor, that is, a single chip microcomputer. In a computer system which has more memory than can be contained on the processor chip, the various propagation delays, which are added to the access time of the memory device, can attain major significance in determining the access time of the memory.

To illustrate the influence of packaging size on performance, let us consider the following hypothetical case. Consider a memory board having an access time of 135 nanoseconds. The memory boards are plugged into a back panel which has a round trip propagation delay of 15 nanoseconds for each card slot. In other words, a computer/memory system which used one memory board, would have a memory access time of $135+15=150$ nanoseconds. The access time of a two board memory system would be 165 nanoseconds, etc. The system we are describing is synchronous and has a clock period of 60 nanoseconds. The maximum number of boards which can be plugged into the system and maintain a three clock period for a memory access will be shown in the equation below:

$N >= ((60 \times 3) - 135)/15$, where

N is an integer, thus $N = 3$

If the memory boards in question have a capacity of 2 megabytes, then the maximum memory size for this system is 6 megabytes. We will assume that the fundamental execution cycle of the computer using this memory is also three clocks or 180 nanoseconds. In other words, a new memory request could be issued every three clocks.

If we wish to increase the maximum capacity of this computer by a factor of four, the number of boards would grow from three to twelve. The access time of a twelve board system would be 315 nanoseconds. However, as our clock period is 60 nanoseconds, a five clock memory access would not be long enough, therefore, six clocks are required. By quadrupling the amount of memory, we will have cut the performance of the computer system in half. The obvious answer to maintaining the performance of a computer then is to continue to increase the intrinsic density of memory so that a memory of the desired size can be constructed which will have an access time of less than the access time desired by the processor itself. In other words, in this example, a four fold increase of density in the memory would have maintained a three clock period and thus, would have maintained the performance of the system.

SUMMARY OF THE INVENTION

One embodiment of the present invention provides a package for a large number of integrated circuits. The described embodiment contains 256 integrated circuits. The package includes a top piece and a bottom piece formed of crystalline silicon or other insulating material with two levels of conductor regions formed in the top and bottom pieces. The integrated circuits are placed vertically between the top and bottom pieces and are held to the top and bottom pieces by high temperature adhesives. Solder balls which are placed on integrated circuits after the fabrication of the integrated circuits are then heated to cause the solder balls to reflow onto their respective connectors in the top and bottom pieces. Tape automated bonding (TAB) type conductors are then connected to the top and bottom pieces so that the integrated circuit held within this embodiment of the present invention may be connected to other circuitry.

DETAILED DESCRIPTION

Figure 1:
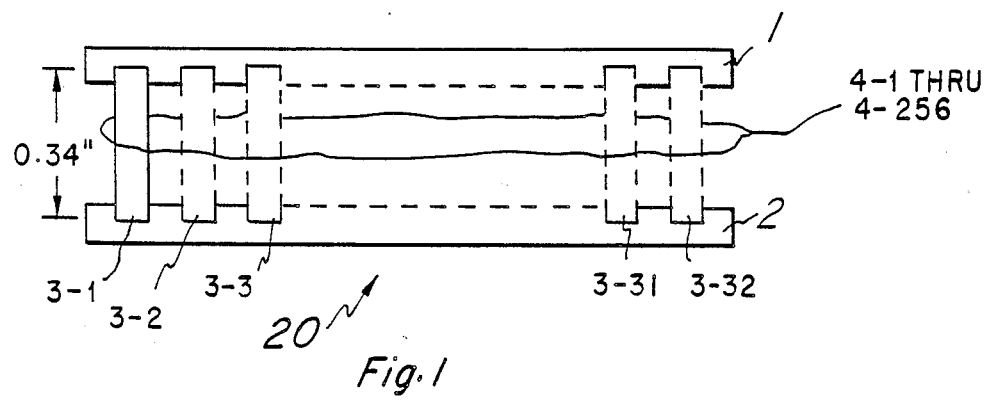
FIG. 1 is a side view of one embodiment of the present invention.

FIG. 1 is a side view of one embodiment of the present invention. This embodiment is designed to contain 256 memory integrated circuits. Each of slots 31-1 through 31-32 contain 8 memory chips. The plane of these chips is perpendicular to the plane of the page. The spaces between the integrated circuits allows adequate ventilation for cooling integrated circuits 4-1 through 4-256. Top piece 1 and bottom piece 2 are silicon substrates having two level conductor patterns formed into them and slots 3-1 through 3-32 cut into both bottom piece 2 and top piece 1 using a precision saw.

Figure 2:
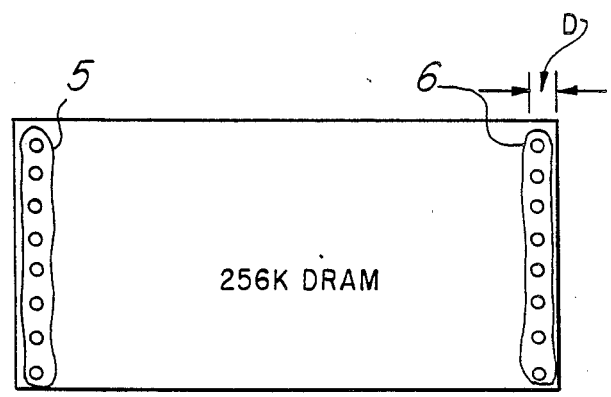
FIG. 2 is a vertical view of an integrated circuit prepared for use in the described embodiment of this invention.

FIG. 2 is a top view of one of the memory chips contained in the embodiment shown in FIG. 1. Integrated circuit 4-X is, for example, a 256K bit dynamic random access memory. Solder ball groups 5 and 6 are positioned on integrated circuit 4-X using techniques well known in the art so that they are spaced a distance D from the edge of integrated circuit 4. Distance D is chosen so that solder ball groups 5 and 6 are in contact with the conductors formed in top and bottom pieces 1 and 2 (FIG. 1) when integrated circuit 4-X is positioned in the structure shown in FIG. 1.

Figure 3:
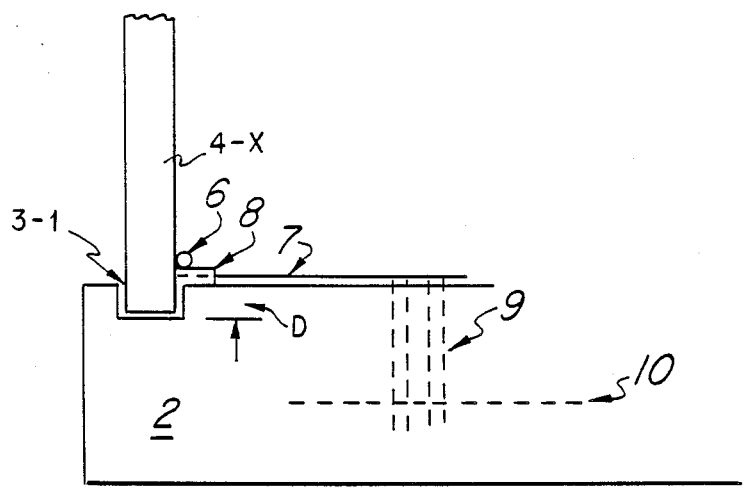
FIG. 3 is a partial side view detailing the interface between the integrated circuits and bottom substrate of the described embodiment of this invention.

FIG. 3 is a detailed diagram showing the interface between one edge of integrated circuit 4-X and bottom piece 2. Conductor patterns 9 and 10 are formed in bottom piece 2 using techniques well known in the art. Integrated circuit 4-X is held in slot 3-1 by high temperature adhesive which is placed in slot 3-1. Distance D is chosen so that solder ball group 6 is directly adjacent to thick conductor 8 which connects with surface conductors 9. This structure is then subject to heating which causes solder balls 6 to reflow and provide a secure electrical connection between integrated circuit 4-X and conductor pattern 7. Buried conductor pattern 10 is connected to conductor pattern 9 via interlevel conductors 9.

Figure 4:
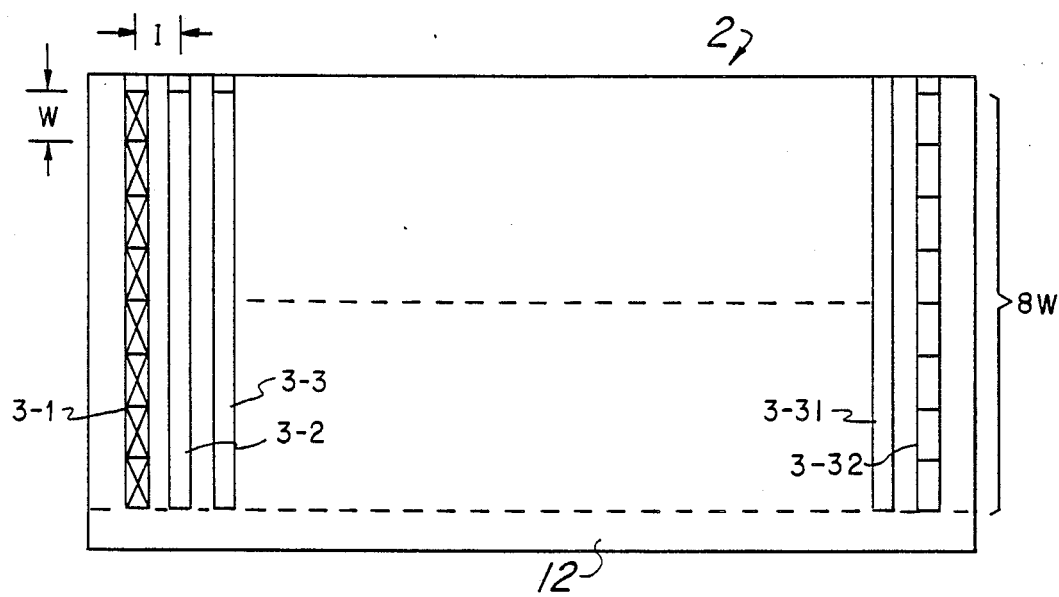
FIG. 4 is a vertical view of one of the top or bottom pieces used in the described embodiment of this invention.

FIG. 4 is a top view of bottom piece 2. Grooves 3-1 through 3-32 are cut into bottom piece 2 using a precision saw. Intergroove spacing I is chosen so that adequate space remains between the grooves for providing conductors to TAB connection area 12. Width W is the width of a single integrated circuit which is contained in grooves 3-1 through 3-32.

Figure 5:
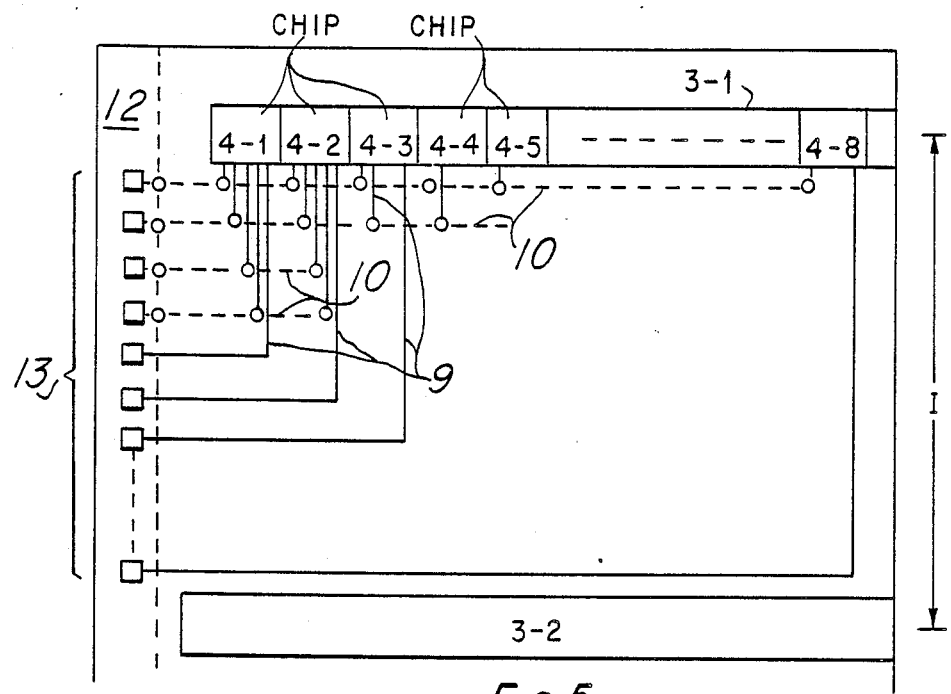
FIG. 5 is a schematic diagram illustrating the conductor routing for one row of the integrated circuits contained in the package of this embodiment.

FIG. 5 is a schematic diagram depicting an incomplete set of conductors from chips 21-28 to TAB conductor connection area 12. One TAB conductor strip will be connected to connection points 13. The dotted conductors are buried conductors 10. The solid lines are conductors 9. The circle conductors are interconnections between top conductors 9 and buried conductors 10. Because the buried conductors require a slightly longer distance in order to go to the buried conductor region and come back to the surface of bottom piece 2, the buried conductors are used for interconnections where speed is not as critical such as power connections and enable/disable lines. Another entire set of conductors is formed in top piece 1 (not shown) so that one piece such as bottom piece 2 may be used to provide data input and output and the other piece such as top piece 1 may be used as address input leads.

Figure 6:
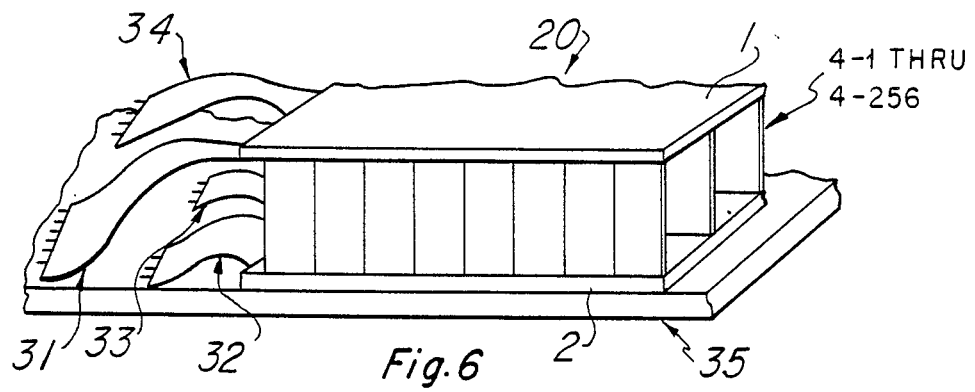
FIG. 6 is an isometric view of a portion of the package of this embodiment of the invention.

FIG. 6 is an isometric view of integrated circuit package 20 including TAB interconnectors 31, 32, 33 and 34. Only four TAB interconnectors are shown in this partial diagram; however, a complete integrated circuit package as described in this embodiment would include eight TAB interconnectors connected to top piece 1 and eight TAB interconnectors connected to bottom piece 2. Integrated circuit package 20 is firmly affixed to circuit board 35 using adhesives. TAB interconnectors such as TAB interconnectors 31-34, provide connections between the integrated circuits contain in integrated circuit package 20 to other circuitry (not shown) in circuit board 35.

Although this specification describes specific embodiments of the present invention, it is not to be construed as limiting the scope of the invention. Other embodiments of the present invention will become evident to those skilled in the art in light of the teachings of this invention. For example, one embodiment of this invention may contain circuits other than memory circuits. This invention is limited only by the claims appended hereto.

TECHNICAL ADVANTAGES

The present invention provides an integrated circuit package which contains integrated circuits in a high density package. Higher density packaging provides the well known advantages of reduced manufacturing costs and increased operating speed.

We claim:
1. An integrated circuit package comprising:
   (a) a first support member having plural parallel grooves formed in a surface thereof and electrical conductors disposed on said surface;
   (b) a second support member having plural parallel grooves formed in a surface thereof and electrical conductors disposed on said surface;
   (c) a plurality of integrated circuits each integrated circuit having a first edge inserted into one of said grooves in said first support piece and having bonding pads disposed along said first edge connected to said electrical conductors in said first support piece and having a second edge opposite said first edge inserted into one of said grooves of said second support piece and having bonding pads disposed along said second edge connected to said electrical conductors in said second support piece;
   (d) a plurality of electrical conductors disposed within said first support member coupled to said electrical conductors on said surface thereof and extending to an external surface of said first support member; and
   (e) a plurality of electrical conductors disposed within said second support member coupled to said electrical conductors on said surface thereof and extending to an external surface of said second support member.

2. A package as set forth in claim 1 wherein said support members are formed of crystalline silicon.

3. A package as set forth in claim 1 wherein said conductors terminate on a surface of their associated support member normal to the direction of said grooves.

4. A package as set forth in claim 2 wherein said conductors terminate on a surface of their associated support member normal to the direction of said grooves.

5. A package as set forth in claim 3 wherein said conductors disposed on said first surface are disposed in a plane parallel to and spaced from said conductors disposed within said first support member.

6. A package as set forth in claim 4 wherein said conductors disposed on said first surface are disposed in a plane parallel to and spaced from said conductors disposed within said first support member.

7. An integrated circuit package comprising:
(a) a first support member having plural parallel grooves formed in a surface thereof and electrical conductors disposed on said surface;
(b) a second support member having plural parallel grooves formed in a surface thereof;
(c) a plurality of integrated circuits each integrated circuit having a first edge inserted into one of said grooves in said first support piece and having bonding pads disposed along said first edge connected to said electrical conductors in said first support piece and having a second edge opposite said first edge inserted into one of said grooves of said second support piece; and
(d) a plurality of electrical conductors disposed within said first support member coupled to said electrical conductors on said surface thereof and extending to an external surface of said first support member.

8. A package as set forth in claim 7 wherein said support members are formed of crystalline silicon.

9. A package as set forth in claim 7 wherein said conductors terminate on a surface of their associated support member normal to the direction of said grooves.

10. A package as set forth in claim 8 wherein said conductors terminate on a surface of their associated support member normal to the direction of said grooves.

11. A package as set forth in claim 9 wherein said conductors disposed on said first surface are disposed in a plane parallel to and spaced from said conductors disposed within said first support member.

12. A package as set forth in claim 10 wherein said conductors disposed on said first surface are disposed in a plane parallel to and spaced from said conductors disposed within said first support member.

* * * * *